(12) United States Patent
Hachigo

(10) Patent No.: US 7,876,163 B2
(45) Date of Patent: Jan. 25, 2011

(54) VOLTAGE-CONTROLLED OSCILLATOR CIRCUIT AND PHASE LOCKED LOOP CIRCUIT USING THE SAME

(75) Inventor: Taketo Hachigo, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 244 days.

(21) Appl. No.: 12/213,369

(22) Filed: Jun. 18, 2008

(65) Prior Publication Data

US 2009/0039969 A1 Feb. 12, 2009

(30) Foreign Application Priority Data

Aug. 6, 2007 (JP) .............. 203739/2007

(51) Int. Cl.
*H03L 7/00* (2006.01)
(52) U.S. Cl. .................. 331/16; 331/34; 331/175; 331/185
(58) Field of Classification Search ............... 331/16, 331/34, 175, 185
See application file for complete search history.

(56) References Cited

U.S. PATENT DOCUMENTS 7,616,067 B2 * 11/2009 Matsumoto et al. .......... 331/16
7,646,253 B2 * 1/2010 Kwan et al. ................. 331/1 R
7,659,782 B2 * 2/2010 Cong ........................... 331/16

FOREIGN PATENT DOCUMENTS

JP 06-152401 1/1996

* cited by examiner

*Primary Examiner*—Arnold Kinkead
(74) *Attorney, Agent, or Firm*—McGinn IP Law Group, PLLC

(57) ABSTRACT

To set a best oscillation state of a voltage-controlled oscillator (VCO) circuit, it is necessary to evaluate variability of manufactured ICs to specify set values based on the variability. Provided is an oscillator including: a terminal receiving a first signal; a VCO coupled to the terminal, the VCO oscillating to generate a second signal and to change a frequency of the second signal in response to an amplitude of the first signal, and revealing gain-slope characteristics in the frequency of the second signal versus the amplitude of the first signal; and a control circuit coupled to the VCO to alter the gain-slope characteristics in response to the amplitude of the first signal, the VCO having so-called self regulating characteristics in which the VCO is locked up based on the variability of the manufactured ICs without depending on external control.

15 Claims, 12 Drawing Sheets

FIG. 5

| RESPONSE TO Vcnt VALUE | | $0 \leq V_{cnt} < V_a$ | $0 < V_a < V_b < V_{dd}$ | | 
|---|---|---|---|---|
| | | | $V_a \leq V_{cnt} < V_b$ | $V_b \leq V_{cnt} \leq V_{dd}$ |
| VALUES OF ON/OFF SIGNALS | Vsw1 VALUE | "LOW" | "HIGH" | "HIGH" |
| | Vsw2 VALUE | "LOW" | "LOW" | "HIGH" |
| STATES OF SWITCH ELEMENTS | SW1, SW3 | "OFF" | "ON" | "ON" |
| | SW2, SW4 | "OFF" | "OFF" | "ON" |

VOLTAGE-CONTROLLED OSCILLATOR CIRCUIT AND PHASE LOCKED LOOP CIRCUIT USING THE SAME

BACKGROUND OF THE INVENTION

1. Field of the Invention

The present invention relates to a voltage-controlled oscillator (hereinafter referred to as VCO) circuit and a phase-locked loop (PLL) circuit using the VCO circuit.

2. Description of the Related Art

FIG. 1 is a block diagram showing a PLL circuit described in JP 06-152401 A (FIG. 1). A three-input one-output switch denoted by reference numeral 4 receives an output signal from a loop filter 3 and two reference voltages VREF1 and VREF2 different from each other and selects one of three inputs in response to a control signal from a calibration circuit 5.

A VCO 2 includes a voltage/current converter (hereinafter referred to as V/I converter) 2A for converting a voltage value "V" into a current value "I", a current-controlled oscillator (hereinafter referred to as ICO) 2B for oscillating a signal having a predetermined frequency in response to an output of the V/I converter 2A, and a gain regulator (denoted by VR in FIG. 1) 2C. The V/I converter 2A receives an output signal from the switch 4 and outputs a signal obtained by V/I conversion to the gain regulator 2C. The gain regulator 2C regulates a value of a current flowing from the V/I converter 2A to the ICO 2B in response to a signal which is based on a gain set value M and outputted from the calibration circuit 5.

According to the PLL circuit which has the structure described above and is manufactured as an integrated circuit (hereinafter referred to as IC), process variability can be compensated, so a loop band can be made constant.

However, the conventional technology described above has a problem in that it is necessary to evaluate variability of manufactured ICs and specify the gain set values M based on the variability.

SUMMARY

In order to solve the above-mentioned problem, an oscillator according to the present invention includes: a terminal receiving a first signal; a voltage-controlled oscillator coupled to the terminal, the voltage-controlled oscillator oscillating to generate a second signal and to change a frequency of the second signal in response to an amplitude of the first signal, and revealing gain-slope characteristics in the frequency of the second signal versus the amplitude of the first signal and a free-running frequency of the second signal; and a first control circuit coupled to the voltage-controlled oscillator to alter the gain-slope characteristics in the frequency of the second signal versus the amplitude of the first signal in response to the amplitude of the first signal.

According to the present invention, it is possible to provide a voltage-controlled oscillator having so-called self regulating characteristics in which a VCO is locked up based on the variability of the manufactured ICs without depending on external control.

BRIEF DESCRIPTION OF THE DRAWINGS

In the accompanying drawings:

FIG. 5 is a table showing an operation of the control circuit according to Embodiment 3 of the present invention;

DETAILED DESCRIPTION OF THE PREFERRED EMBODIMENTS

Hereinafter, specific embodiments of the present invention are described in detail with reference to the attached drawings. The same elements in each of the drawings are expressed by the same reference symbols and a duplicated description thereof is omitted if necessary in order to avoid unnecessary complication.

Embodiment 1

Figure 1:
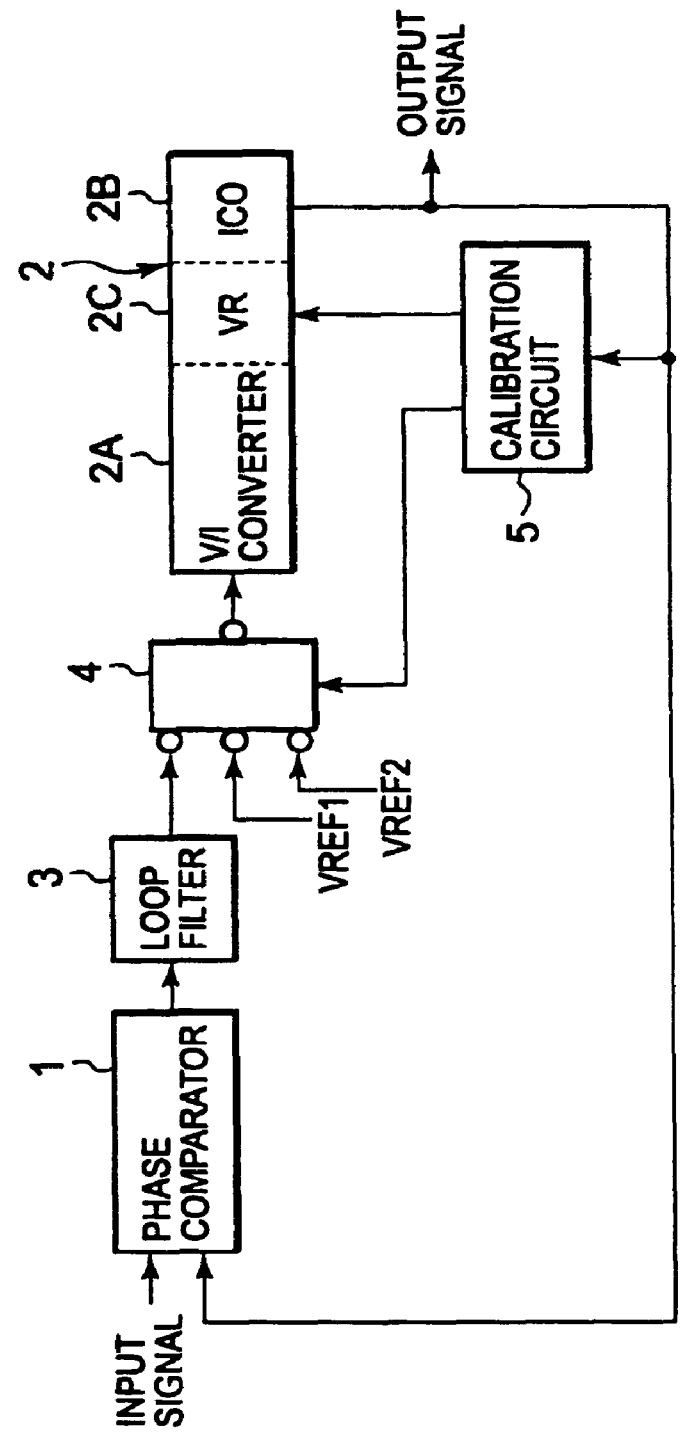
FIG. 1 is a block diagram showing a conventional PLL circuit.
Figure 2:
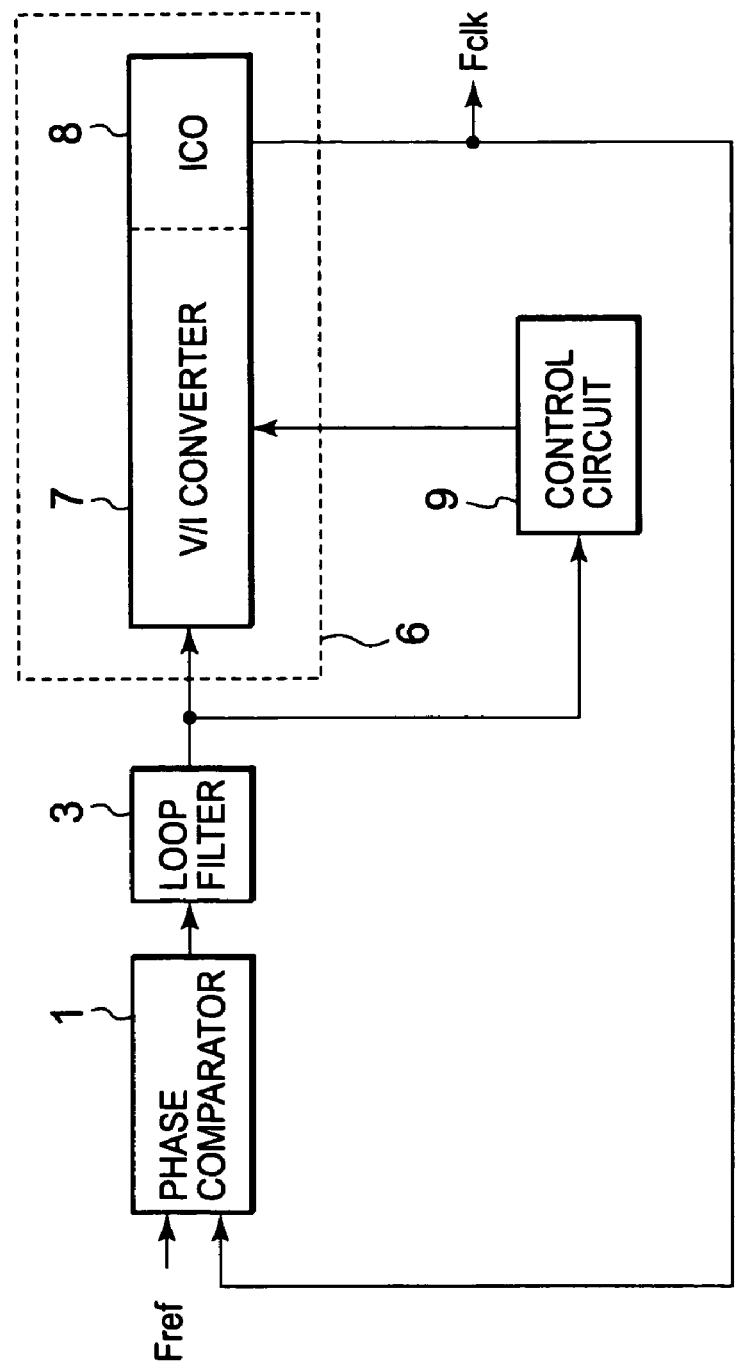
FIG. 2 is a block diagram showing a VCO circuit and a PLL circuit using the VCO circuit according to Embodiment 1 of the present invention.

FIG. 2 is a block diagram showing a VCO circuit and a PLL circuit using the VCO circuit according to Embodiment 1 of the present invention. A phase comparator 1 compares a phase of a reference signal Fref and a phase of an oscillation signal Fclk of a VCO 6 and outputs a signal corresponding to a difference between the phases to a loop filter 3. The VCO 6 outputs the oscillation signal Fclk having a predetermined frequency in response to a control voltage Vcnt outputted from the loop filter 3.

The phase comparator 1, the loop filter 3, and the VCO 6 serve as the PLL circuit. A frequency divider (not shown) may be inserted between the VCO 6 and the phase comparator 1 to construct a multiplying PLL circuit.

The VCO 6 includes a V/I converter 7 and an ICO 8. The V/I converter 7 converts the control voltage Vcnt into a control current Icnt. The ICO 8 oscillates a signal having a predetermined frequency in response to the control current Icnt. A control circuit 9 controls a value of the control current Icnt to be supplied from the V/I converter 7 to the ICO 8 in response to the control voltage Vcnt.

Embodiment 2

Figure 3:
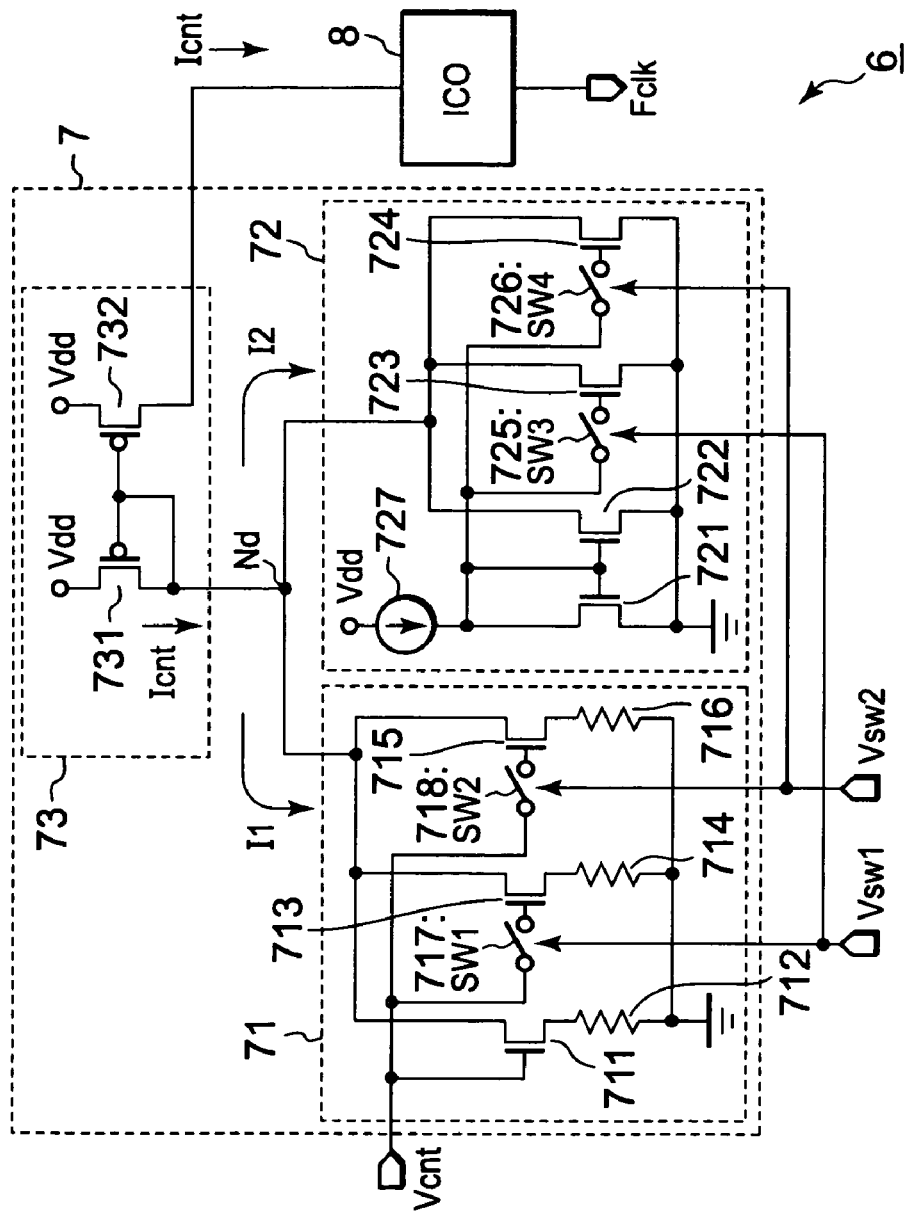
FIG. 3 is a circuit diagram showing a structure of a VCO circuit according to Embodiment 2 of the present invention.

FIG. 3 is a circuit diagram showing a structure of the VCO 6 according to Embodiment 2 of the present invention. The V/I converter 7 includes a gain circuit 71 into which a control current I1 flows in response to the control voltage Vcnt, a offset circuit 72 into which a control current I2 for determining a free-running frequency, and a current mirror circuit 73 for supplying, to the ICO 8, the control current Icnt obtained by adding the control current I1 to the control current I2. The ICO 8 outputs the oscillation signal Fclk having the predetermined frequency in response to the supplied control current Icnt.

The gain circuit 71 includes three (first, second, and third) current paths coupled in parallel. The first current path includes a transistor 711 having a source coupled in series to a resistor 712. The second current path includes a transistor 713 having a source coupled in series to a resistor 714. The third current path includes a transistor 715 having a source coupled in series to a resistor 716. Drains of the three transistors 711, 713, and 715 are coupled in common to a node Nd to suck the control current I1 therethrough.

A gate of the transistor 711 is directly inputted with the control voltage Vcnt. A gate of the transistor 713 is inputted with the control voltage Vcnt through a switch element 717. A gate of the transistor 715 is inputted with the control voltage Vcnt through a switch element 718. The switch element (hereinafter referred to as SW1) 717 is turned on/off in response to an on/off signal Vsw1. The switch element (hereinafter referred to as SW2) 718 is turned on/off in response to an on/off signal Vsw2.

The offset circuit 72 includes (fourth, fifth, and sixth) current paths coupled in parallel. The fourth current path includes a transistor 722. The fifth current path includes a transistor 723. The sixth current path includes a transistor 724. Drains of the three transistors 722, 723, and 724 are coupled in common to the node Nd to suck the control current I2 therethrough.

A constant current source 727 and a transistor 721 serve as a current mirror circuit and a potential mirrored thereby is inputted to a gate of the transistor 722. A gate of the transistor 723 is inputted with the potential inputted to the gate of the transistor 722 through a switch element 725. A gate of the transistor 724 is inputted with the potential inputted to the gate of the transistor 722 through a switch element 726. The switch element (hereinafter referred to as SW3) 725 is turned on/off in response to the on/off signal Vsw1. The switch element (hereinafter referred to as SW4) 726 is turned on/off in response to the on/off signal Vsw2.

The circuit 73 includes two transistors 731 and 732 serving as a current mirror for the control current Icnt obtained by combining the control currents I1 and I2 at the node Nd and mirrors the control current Icnt to be supplied to the ICO 8.

Figure 6:
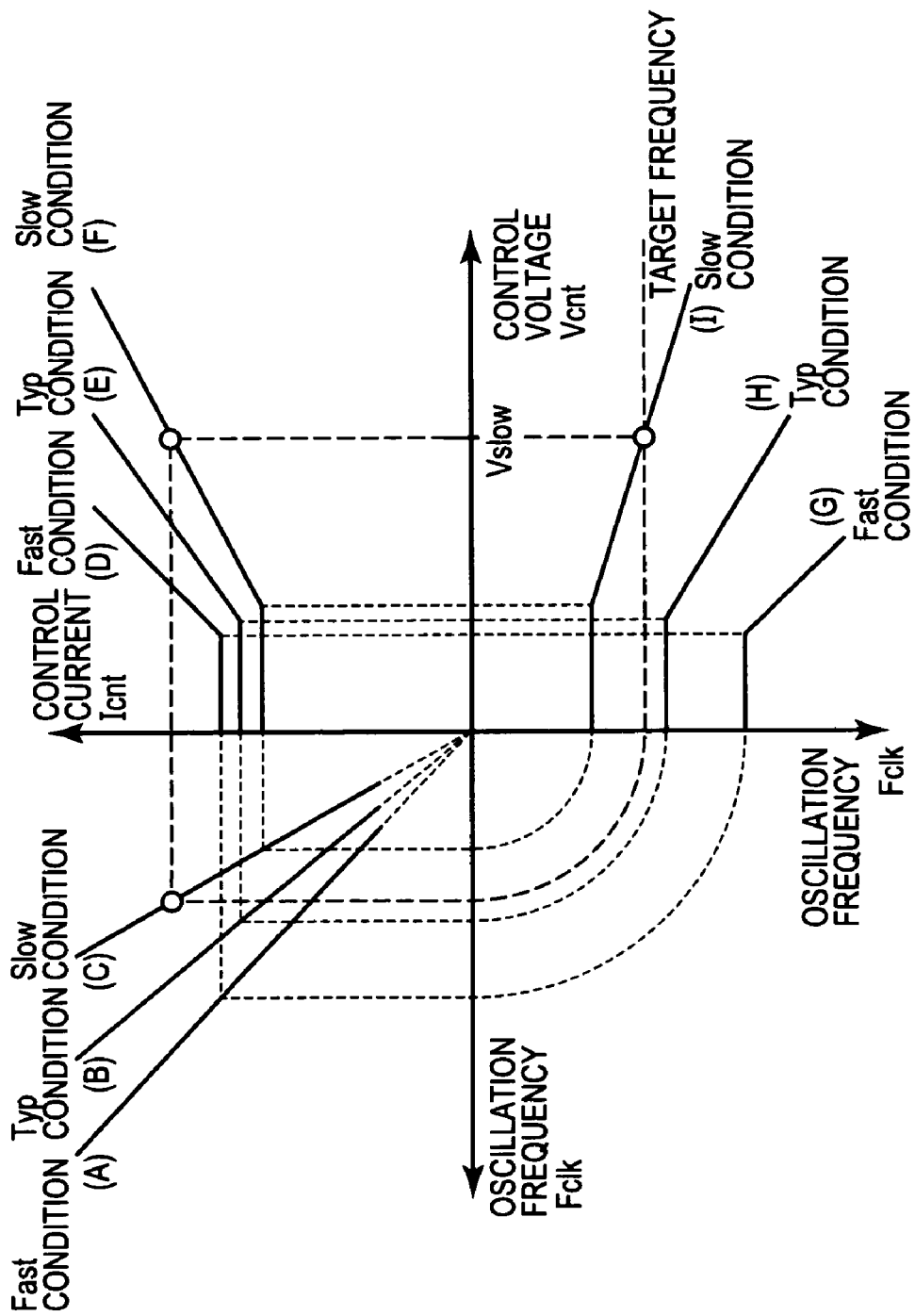
FIG. 6 is a graph showing input and output characteristics of a VCO according to Embodiment 3 of the present invention.
Figure 7:
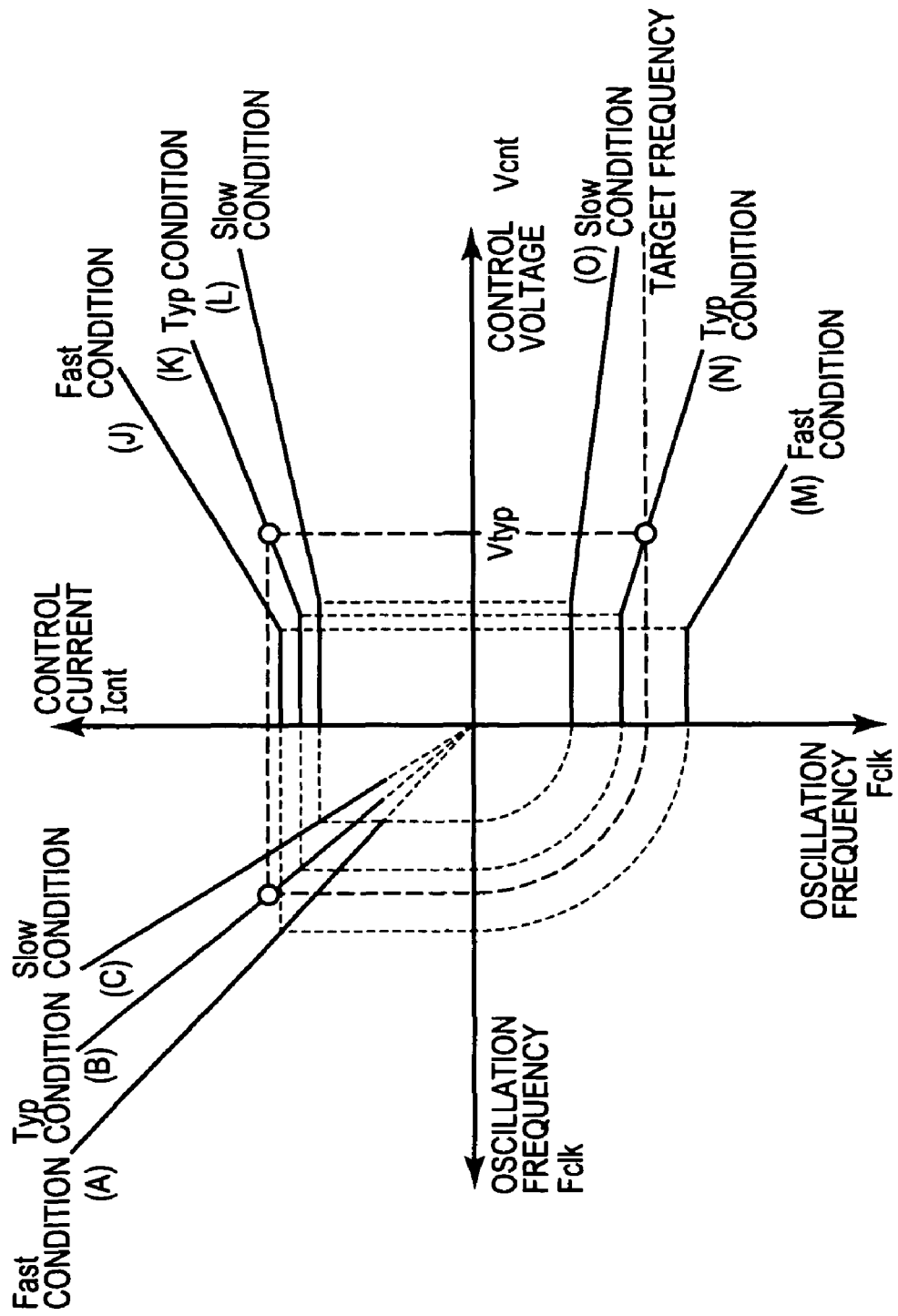
FIG. 7 is another graph showing the input and output characteristics of the VCO according to Embodiment 3 of the present invention.
Figure 8:
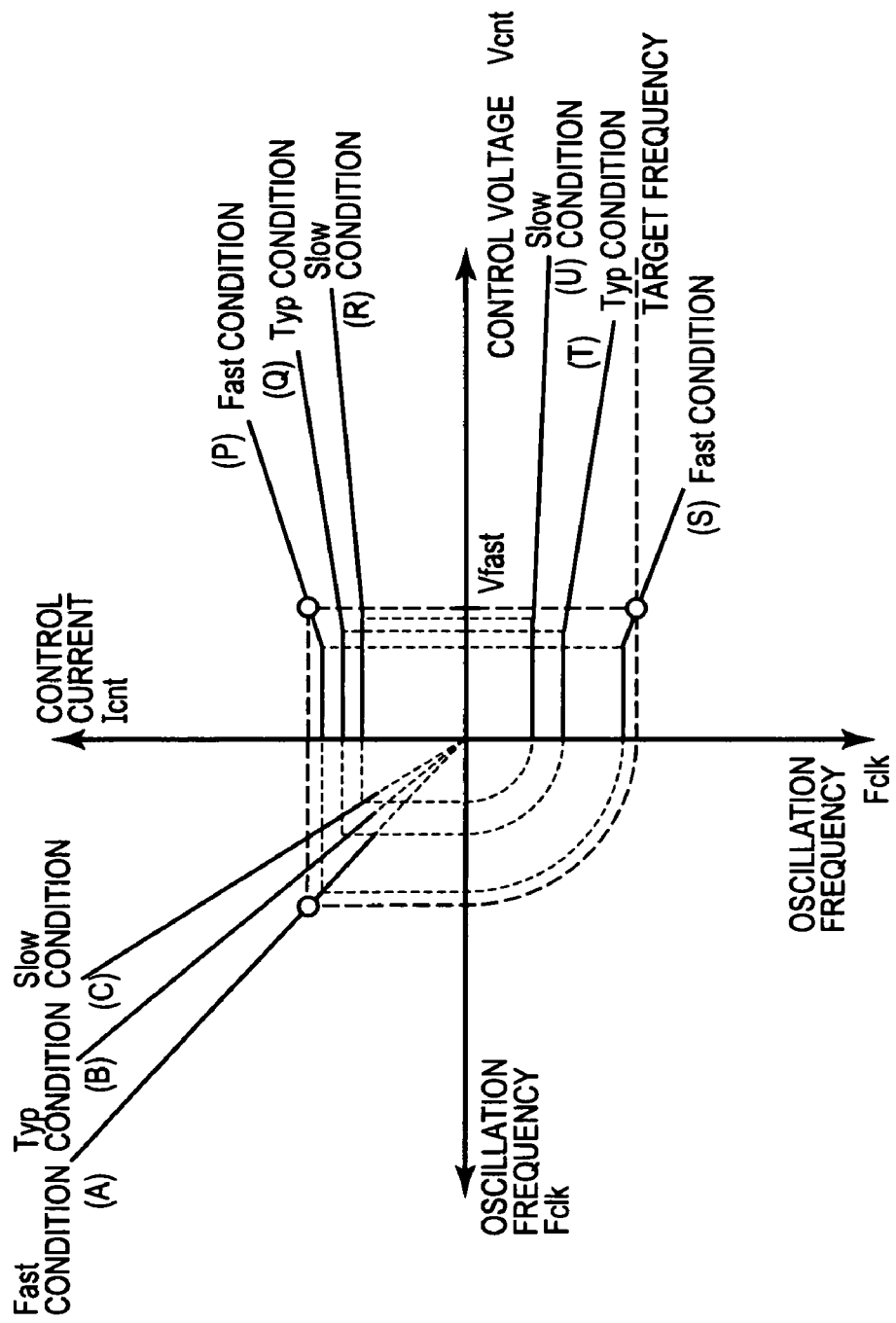
FIG. 8 is still another graph showing the input and output characteristics of the VCO according to Embodiment 3 of the present invention.

FIGS. 6 to 8 are graphs showing input and output characteristics of the VCO 6 shown in FIG. 3. FIG. 6 shows the case where the switch elements SW1 to SW4 are in an on-state. FIG. 7 shows the case where the switch elements SW1 and SW3 are in the on-state and the switch elements SW2 and SW4 are in an off-state. FIG. 8 shows the case where the switch elements SW1 to SW4 are in the off-state.

In each of FIGS. 6 to 8, "Fast condition", "Typ condition", and "Slow condition" indicate variability in process conditions for the VCO 6 manufactured as an IC. "Fast condition" indicates one deviation of variability in process conditions (resistance values, transistor parameter values, and parasitic capacitance values of wirings) necessary to obtain a maximum output speed of a circuit manufactured as an IC. "Slow condition" indicates another deviation of variability in process conditions necessary to obtain a minimum output speed of the circuit manufactured as the IC. "Typ condition" indicates a typical process condition necessary to obtain the most common output speed of the circuit manufactured as the IC. Note that variability in environmental conditions, that is, variability in temperature and power supply voltage Vdd are not taken into account.

In FIG. 6, each of (A), (B), and (C) shows the input and output characteristic of the ICO 8, that is, the dependent characteristic of an oscillation frequency of the oscillation signal Fclk on a current value of the control current Icnt. Note that (A), (B), and (C) in FIG. 7 have the same input and output characteristics as (A), (B), and (C) in FIG. 6 and (A), (B), and (C) in FIG. 8 have the same input and output characteristics as (A), (B), and (C) in FIG. 6.

For example, when the ICO 8 includes a ring oscillator circuit, the oscillation frequency of the current-controlled oscillator is determined based on a delay value, that is, a switching speed, of an inverter circuit included in the ring oscillator circuit. The ring oscillator circuit employs a structure in which the control current Icnt is supplied to adjust the switching speed. Therefore, the switching speed of the inverter circuit included in the ring oscillator circuit in "Fast condition" is high. Thus, when a signal having the same oscillation frequency is to be obtained, a current value can be made smaller than the control current Icnt in "Typ condition". In contrast, the switching speed of the inverter circuit included in the ring oscillator circuit in "Slow condition" is low. Thus, when the signal having the same oscillation frequency is to be obtained, a current value larger than the control current Icnt in "Typ condition" is necessary.

In FIG. 6, (A), (B), and (C) correspond to "Fast condition", "Typ condition", and "Slow condition", respectively. The reason why the respective slopes are different from each other and a current value of the control current Icnt becomes larger in the order of "Fast condition", "Typ condition", and "Slow condition" in order to obtain a target frequency indicated in FIG. 6 is as described above.

In FIG. 6, each of (D), (E), and (F) has the input and output characteristic of the V/I converter 7, that is, the dependent characteristic of the current value of the control current Icnt on the voltage value of the control voltage Vcnt. In FIG. 6, (D), (E), and (F) correspond to "Fast condition", "Typ condition", and "Slow condition", respectively.

Each of the input and output characteristics shown in (D), (E), and (F) of FIG. 6 exhibits that the control current Icnt is a constant current value until the control voltage Vcnt reaches a predetermined voltage value. The reason for this is as follows. The transistors 711, 713, and 715 of the gain circuit 71 are in an off-state until the control voltage Vcnt reaches the predetermined voltage value, so the control current I1 is zero. In contrast, the transistors 722, 723, and 724 of the offset circuit 72 are continuously in an on-state, so the control current I2 mirrored by the current mirror circuit including the constant current source 727 and the transistor 721 continuously flows.

The state in which the control current Icnt whose current value is constant flows until the control voltage Vcnt reaches the predetermined voltage value is referred to as a free-run state because the control current Icnt flows without depending on the control voltage Vcnt to determine the oscillation frequency of the oscillation signal Fclk from the ICO 8. An oscillation frequency in this state is referred to as a free-running oscillation frequency.

The free-running oscillation frequency is determined depending on the control current I2, that is, depending mainly on the abilities of the transistors 722, 723, and 724, so the frequency value becomes smaller in the order of "Fast condition", "Typ condition", and "Slow condition".

When the control voltage Vcnt exceeds the predetermined voltage value, the transistors 711, 713, and 715 of the gain circuit 71 are turned on. Therefore, each of the input and output characteristics shown in (D), (E), and (F) of FIG. 6 exhibits that the current value of the control current Icnt increases in response to an increase in the control voltage Vcnt. The increase characteristics shown in (D), (E), and (F) of FIG. 6 are determined depending mainly on the abilities of the transistors 711, 713, and 715, so the slopes of the increase characteristics become gentle in the order of "Fast condition", "Typ condition", and "Slow condition".

In FIG. 6, each of (G), (H), and (I) shows the input and output characteristic of the VCO 6, that is, the dependent characteristic of the oscillation frequency of the oscillation signal Fclk on the voltage value of the control voltage Vcnt. In FIG. 6, (G), (H), and (I) show a composite characteristic of (A) and (D), a composite characteristic of (B) and (E), and a composite characteristic of (C) and (F), respectively. In FIG. 6, (G), (H), and (I) correspond to "Fast condition", "Typ condition", and "Slow condition", respectively.

The dependence of the frequency of the oscillation signal Fclk on the control voltage Vcnt, that is, each of the slopes of the increase characteristics shown in (G), (H), and (I) of FIG. 6 is referred to as a conversion gain Kvco with a unit of Hz/V and expressed by the following equation.

$$Fclk = Kvco \times Vcnt \quad \text{(Equation 1)}$$

The control voltage Vcnt is minutely vibrated by a noise component of the phase comparator 1, a leakage component of the loop filter 3, an electric charge redistribution of the loop filter 3, or the like. When the vibration component of the control voltage is expressed by $\Delta Vcnt$ and a vibration component of the frequency of the oscillation signal is expressed by $\Delta Fclk$, the following equation is obtained.

$$Fclk + \Delta Fclk = Kvco \times (Vcnt + \Delta Vcnt) \quad \text{(Equation 2)}$$

where $\Delta Fclk$ means a jitter component and can be expressed by the following equation.

$$\Delta Fclk = Kvco \times \Delta Vcnt \quad \text{(Equation 3)}$$

In other words, the jitter can be reduced by suppressing the conversion gain Kvco to a small value. As is also apparent from (G), (H), and (I) in FIG. 6, when the conversion gain Kvco corresponding to each of the slopes of the increase characteristics shown in (G), (H), and (I) of FIG. 6 is small, the variation in frequency of the oscillation signal Fclk is suppressed with respect to the variation in the control voltage Vcnt.

In FIG. 6, (D) to (I) show the respective input and output characteristics in the case where the switch elements SW1 to SW4 are in the on-state. In FIG. 7, (J) to (O) show the input and output characteristics in the case where the switch elements SW1 and SW3 are in the on-state and the switch elements SW2 and SW4 are in the off-state. In FIG. 8, (P) to (U) show the input and output characteristics in the case where the switch elements SW1 to SW4 are in the off-state.

In each of FIGS. 6 to 8, in order to obtain a common target frequency in specifications, the current value of the control current Icnt becomes larger in the order of "Fast condition", "Typ condition", and "Slow condition", with the result that the voltage value of the control voltage Vcnt also becomes lager. Therefore, the dependent characteristic of the oscillation frequency of the oscillation signal Fclk on the voltage value of the control voltage Vcnt is described in detail below with reference to FIGS. 6 to 8 in view of the reduction in jitter described above.

The input and output characteristic in "Slow condition" shown in (I) of FIG. 6 is a characteristic in which the jitter can be minimized when the oscillation signal Fclk having the target frequency is obtained, that is, the conversion gain Kvco is minimum.

The reasons why such a characteristic is obtained are as follows. The first reason is that the voltage value (expressed by Vslow in FIG. 6) of the control voltage Vcnt for obtaining the target frequency is a maximum of the respective process conditions. The second reason is that the free-running oscillation frequency is brought close to the target frequency in the input and output characteristic of "Slow condition" shown in (I) of FIG. 6. The third reason is that the slope of the increase characteristic is necessarily made gentle because of the second reason.

The first reason is based on the point that the input and output characteristics of the ICO 8, that is, the characteristics in which the current value of the control current Icnt and the voltage value of the control voltage Vcnt become larger in the order of "Fast condition", "Typ condition", and "Slow condition" in order to obtain the target frequency, are read and applied.

The second reason is based on the point that both the switch elements SW3 and SW4 are turned on to maximize the control current I2 of the offset circuit 72, that is, the current value for determining the free-running oscillation frequency.

The third reason is based on the point that the increase characteristic in "Slow condition" of all the process conditions has the gentlest slope. Therefore, in order to obtain the oscillation frequency which is the target frequency in "Slow condition", it is necessary to turn on both the switch elements SW1 and SW2 to maximize the slope of the increase characteristic.

From the above description, the input and output characteristic of "Slow condition" in FIG. 6 is the most suitable characteristic in view of the reduction in jitter.

The input and output characteristic in "Fast condition" shown in (S) of FIG. 8 is a characteristic in which the jitter can be minimized when the oscillation signal Fclk having the target frequency is obtained.

The reasons why such a characteristic is obtained are as follows. The first reason is that the voltage value (expressed by Vfast in FIG. 8) of the control voltage Vcnt for obtaining the target frequency is a minimum of the respective process conditions. The second reason is that the free-running oscillation frequency is brought close to the target frequency in the input and output characteristic of "Fast condition" shown in (S) of FIG. 8. The third reason is that the slope of the increase characteristic is necessarily made gentle because of the second reason.

The first reason is based on the point that the input and output characteristics of the ICO 8, that is, the characteristics in which the current value of the control current Icnt and the voltage value of the control voltage Vcnt become smaller in the order of "Slow condition", "Typ condition", and "Fast condition" in order to obtain the target frequency, are read and applied.

The second reason is based on the point that both the switch elements SW3 and SW4 are turned off to minimize the control current I2 of the offset circuit 72, that is, the current value for determining the free-running oscillation frequency.

The third reason is based on the point that "Fast condition" of all the process conditions is a condition in which the increase characteristic has the steepest slope. Therefore, both the switch elements SW1 and SW2 are turned off to minimize the dependent characteristic of the current value of the control current I1 on the voltage value of the control voltage Vcnt in the gain circuit 71.

From the above description, the input and output characteristic of "Fast condition" in FIG. 8 is the most suitable characteristic in view of the reduction in jitter.

The input and output characteristic in "Typ condition" shown in (N) of FIG. 7 requires an intermediate characteristic between "Slow condition" and "Fast condition" as described above in order to obtain the target frequency in the typical process condition necessary to obtain the most common output speed of the circuit manufactured as the IC.

That is, an input and output characteristic is embodied in which the oscillation frequency of the oscillation signal Fclk can be controlled in response to the control voltage Vcnt in the vicinity of the voltage value (expressed by Vtyp in FIG. 7) of the control voltage Vcnt for obtaining the target frequency. This can be realized in the case where the switch elements SW1 and SW3 are turned on and the switch elements SW2 and SW4 are turned off.

Embodiment 3

Figure 4:
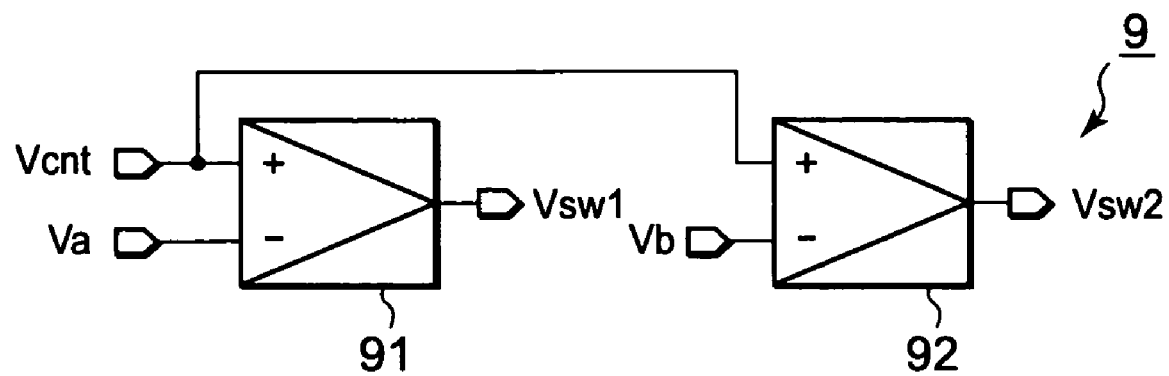
FIG. 4 is a block diagram showing a structure of a control circuit according to Embodiment 3 of the present invention.

FIG. 4 is a block diagram showing a structure of the control circuit 9 in Embodiment 3 of the present invention. Voltage comparators 91 and 92 compare the control voltage Vcnt with reference voltages Va and Vb to generate the on/off signals Vsw1 and Vsw2, respectively.

FIG. 5 is a table showing the operation of the circuit shown in FIG. 4 and the responses of the circuit shown in FIG. 3. The two reference voltages Va and Vb are higher than zero volts and lower than the power supply voltage Vdd. The reference voltage Vb is higher than the reference voltage Va. Best voltage values to be applied to the two reference voltages Va and Vb are described later.

When the control voltage Vcnt is equal to or higher than zero volts and lower than the reference voltage Va, the on/off signal Vsw1 which is an output signal from the voltage comparator 91 is "Low". When the control voltage Vcnt is higher than the reference voltage Va and equal to or lower than the power supply voltage Vdd, the on/off signal Vsw1 is "High".

Therefore, when the control voltage Vcnt is equal to or higher than zero volts and lower than the reference voltage Va, the switch elements SW1 and SW3 become the off-state. When the control voltage Vcnt is higher than the reference voltage Va and equal to or lower than the power supply voltage Vdd, the switch elements SW1 and SW3 become the on-state.

When the control voltage Vcnt is equal to or higher than zero volts and lower than the reference voltage Vb, the on/off signal Vsw2 which is an output signal from the voltage comparator 92 is "Low". When the control voltage Vcnt is higher than the reference voltage Vb and equal to or lower than the power supply voltage Vdd, the on/off signal Vsw2 is "High".

Therefore, when the control voltage Vcnt is equal to or higher than zero volts and lower than the reference voltage Vb, the switch elements SW2 and SW4 become the off-state. When the control voltage Vcnt is higher than the reference voltage Vb and equal to or lower than the power supply voltage Vdd, the switch elements SW2 and SW4 become the on-state.

Figure 9:
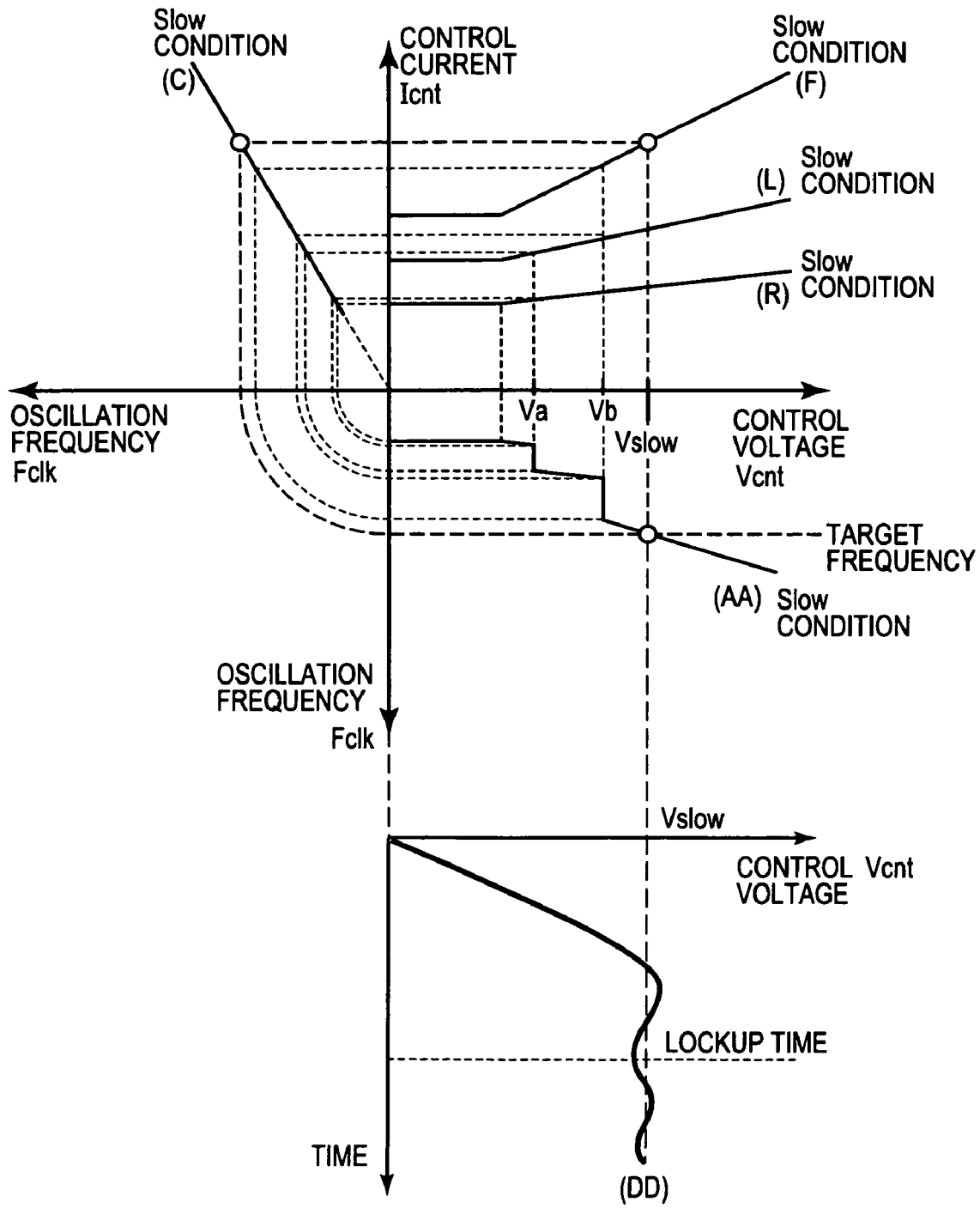
FIG. 9 is a graph showing a "Slow condition" input and output characteristic of the VCO according to Embodiment 3 of the present invention.
Figure 10:
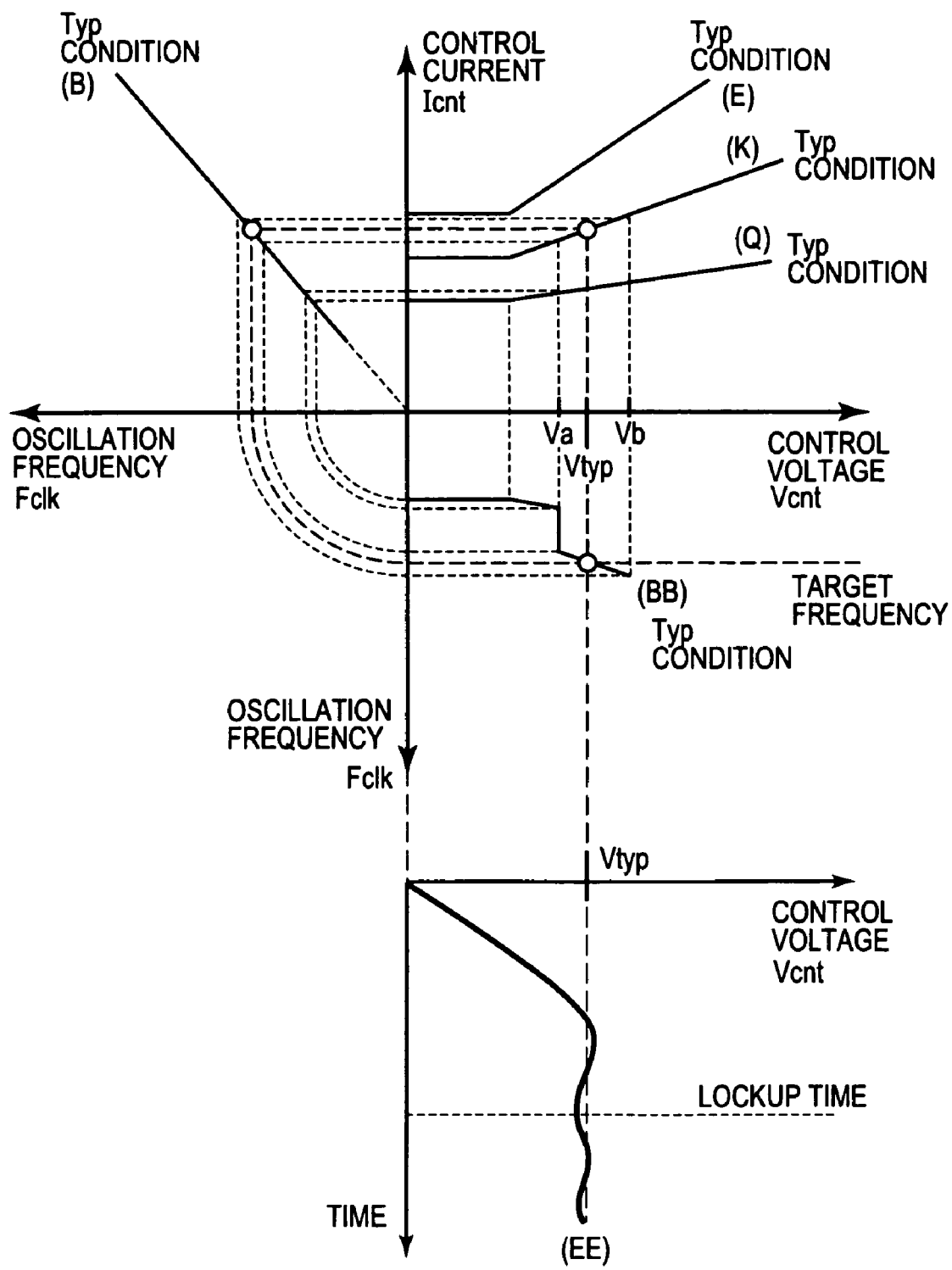
FIG. 10 is a graph showing a "Typ condition" input and output characteristic of the VCO according to Embodiment 3 of the present invention.
Figure 11:
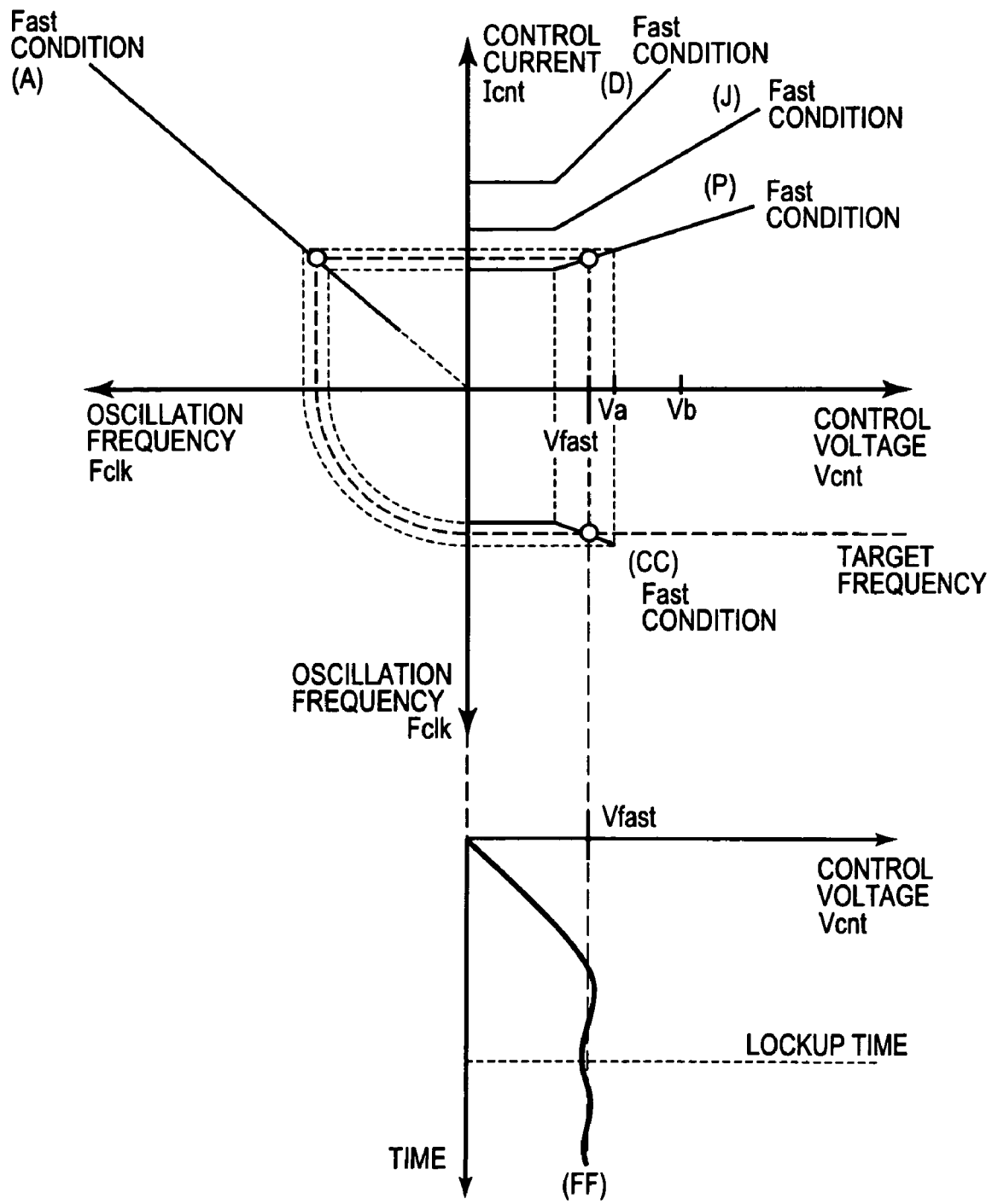
FIG. 11 is a graph showing a "Fast condition" input and output characteristic of the VCO according to Embodiment 3 of the present invention.

FIGS. 9, 10, and 11 are graphs each showing an input and output characteristic of the VCO 6 shown in FIG. 3 and a lockup characteristic thereof and correspond to "Fast condition", "Typ condition", and "Slow condition", respectively.

In FIG. 9, (C) shows the same input and output characteristic in "Slow condition" as (C) of FIG. 6, (C) of FIG. 7, or (C) of FIG. 8, that is, the dependent characteristic of the oscillation frequency of the oscillation signal Fclk on the current value of the control current Icnt.

In FIG. 9, (F) shows the same input and output characteristic as (F) of FIG. 6, that is, the dependent characteristic of the current value of the control current Icnt on the voltage value of the control voltage Vcnt, which is obtained in the case where the switch elements SW1 to SW4 are in the on-state.

In FIG. 9, (L) shows the same input and output characteristic as (L) of FIG. 7, which is obtained in the case where the switch elements SW1 and SW3 are in the on-state and the switch elements SW2 and SW4 are in the off-state.

In FIG. 9, (R) shows the same input and output characteristic as (R) of FIG. 8, which is obtained in the case where the switch elements SW1 to SW4 are in the off-state.

In each of FIGS. 9 to 11, reference symbols Va and Vb indicate the reference voltages of the control circuit 9 shown in FIG. 5. A set voltage value of the reference voltage Va is an intermediate voltage value between the voltage Vfast shown in FIG. 8 and the voltage Vtyp shown in FIG. 7. A set voltage value of the reference voltage Vb is an intermediate voltage value between the voltage Vtyp shown in FIG. 7 and the voltage Vslow shown in FIG. 6.

In FIG. 9, (AA) shows the input and output characteristic of the VCO 6 in "Slow condition", that is, the dependent characteristic of the oscillation frequency of the oscillation signal Fclk on the voltage value of the control voltage Vcnt. Note that (AA) in FIG. 9 shows the characteristic in which the constituent elements of the VCO 6 shown in FIG. 3 and the constituent elements of the control circuit 9 shown in FIG. 4 have the coupling relationship shown in FIG. 2.

In FIG. 9, (AA) shows the characteristic obtained by combining one of (F), (L), and (R) of FIG. 9 with (C) of FIG. 9 based on the on/off states of the switch elements SW1, SW2, SW3, and SW4. In other words, when the control voltage Vcnt is equal to or higher than zero volts and lower than the reference voltage Va, the input and output characteristic obtained by combining (R) of FIG. 9 with (C) of FIG. 9 is shown. When the control voltage Vcnt is equal to or higher than the reference voltage Va and lower than the reference voltage Vb, the input and output characteristic obtained by combining (L) of FIG. 9 with (C) of FIG. 9 is shown. When the control voltage Vcnt is equal to or higher than the reference voltage Vb and equal to or lower than the power supply voltage Vdd, the input and output characteristic obtained by combining (F) of FIG. 9 with (C) of FIG. 9 is shown.

In FIG. 9, (DD) is a graph showing the lockup characteristic in "Slow condition". The control voltage Vcnt increases with time toward the voltage Vslow defined in FIG. 6. Then, the control voltage Vcnt converges to the voltage Vslow while reducing vibration. During the increase in the control voltage Vcnt, the switch elements are changed from a first state (SW1="Off", SW2="Off", SW3="Off", and SW4="Off") to a second state (SW1="On", SW2="Off", SW3="On", and SW4="Off"). Then, the switch elements are changed to a third state (SW1="On", SW2="On", SW3="On", and SW4="On").

After that, when the amplitude of the control voltage Vcnt which vibrates relative to the voltage Vslow is held to a value equal to or smaller than a predetermined value, a lockup state is determined.

In FIG. 10, (B) shows the same input and output characteristic in "Typ condition" as (B) of FIG. 6, (B) of FIG. 7, or (B) of FIG. 8. In FIG. 10, (E) shows the same input and output characteristic as (E) of FIG. 6, which is obtained in the case where the switch elements SW1 to SW4 are in the on-state. In FIG. 10, (K) shows the same input and output characteristic as (K) of FIG. 7, which is obtained in the case where the switch elements SW1 and SW3 are in the on-state and the switch elements SW2 and SW4 are in the off-state. In FIG. 10, (Q) shows the same input and output characteristic as (Q) of FIG. 8, which is obtained in the case where the switch elements SW1 to SW4 are in the off-state.

In FIG. 10, (BB) shows the input and output characteristic of the VCO 6 in "Typ condition". In FIG. 10, (BB) shows the characteristic obtained by combining one of (E), (K), and (Q) of FIG. 10 with (B) of FIG. 10 based on the on/off states of the switch elements SW1, SW2, SW3, and SW4. In other words, when the control voltage Vcnt is equal to or higher than zero volts and lower than the reference voltage Va, the input and output characteristic obtained by combining (Q) of FIG. 10 with (B) of FIG. 10 is shown. When the control voltage Vcnt is equal to or higher than the reference voltage Va and lower than the reference voltage Vb, the input and output characteristic obtained by combining (K) of FIG. 10 with (B) of FIG. 10 is shown.

In FIG. 10, (EE) is a graph showing the lockup characteristic in "Typ condition". The control voltage Vcnt increases with time toward the voltage Vtyp defined in FIG. 7. Then, the control voltage Vcnt converges to the voltage Vtyp while reducing vibration. During the increase in the control voltage Vcnt, the switch elements are changed from the first state (SW1="Off", SW2="Off", SW3="Off", and SW4="Off") to the second state (SW1="On", SW2="Off", SW3="On", and SW4="Off").

After that, when the amplitude of the control voltage Vcnt which vibrates relative to the voltage Vtyp is held to the value equal to or smaller than a predetermined value, the lockup state is determined.

In FIG. 11, (A) shows the same input and output characteristic in "Fast condition" as (A) of FIG. 6, (A) of FIG. 7, or (A) of FIG. 8. In FIG. 11, (D) shows the same input and output characteristic as (D) of FIG. 6, which is obtained in the case where the switch elements SW1 to SW4 are in the on-state. In FIG. 11, (J) shows the same input and output characteristic as (J) of FIG. 7, which is obtained in the case where the switch elements SW1 and SW3 are in the on-state and the switch elements SW2 and SW4 are in the off-state. In FIG. 11, (P) shows the same input and output characteristic as (P) of FIG. 8, which is obtained in the case where the switch elements SW1 to SW4 are in the off-state.

In FIG. 11, (CC) shows the input and output characteristic of the VCO 6 in "Fast condition". Unlike the cases of "Slow condition" and "Typ condition, (CC) in FIG. 11 shows the input and output characteristic obtained by combining (P) of FIG. 11 with (A) of FIG. 11 only in the case where the control voltage Vcnt is equal to or higher than zero volts and lower than the reference voltage Va.

In FIG. 11, (FF) is a graph showing the lockup characteristic in "Fast condition". The control voltage Vcnt increases with time toward the voltage Vfast defined in FIG. 8. Then, the control voltage Vcnt converges to the voltage Vfast while reducing vibration. During the increase in the control voltage Vcnt, the switch elements are only in the first state (SW1="Off", SW2="Off", SW3="Off", and SW4="Off").

After that, when the amplitude of the control voltage Vcnt which vibrates relative to the voltage Vfast is held to a value equal to or smaller than the predetermined value, the lockup state is determined.

As described above, each of (DD) of FIG. 9, (EE) of FIG. 10, and (FF) of FIG. 11 which are graphs showing the lockup characteristics corresponding to the respective process conditions of "Slow condition", "Typ condition", and "Fast condition" exhibits that the control voltage Vcnt converges to corresponding one of the voltages Vslow, Vtyp, and Vfast in order to lock up to the common target frequency.

The input and output characteristics of (F) of FIG. 9, (K) of FIG. 10, and (P) of FIG. 11, each of which is the most suitable characteristic in view of the reduction in jitter, are selected as the input and output characteristics of the V/I converter 7 at the time point when the lockup is determined. The lockup operations are controlled based on variability in manufacturing conditions for manufactured ICs without depending on external control. Therefore, the voltage-controlled oscillator has a mechanism with self regulating characteristics.

The voltage-controlled oscillator with the self regulating characteristics according to the present invention is based on the point that the input and output characteristics of the ICO 8, that is, the characteristics in which the current value of the control current Icnt and the voltage value of the control voltage Vcnt become larger in the order of "Fast condition", "Typ condition", and "Slow condition" in order to obtain the target frequency, are read and applied.

Embodiment 4

Figure 12:
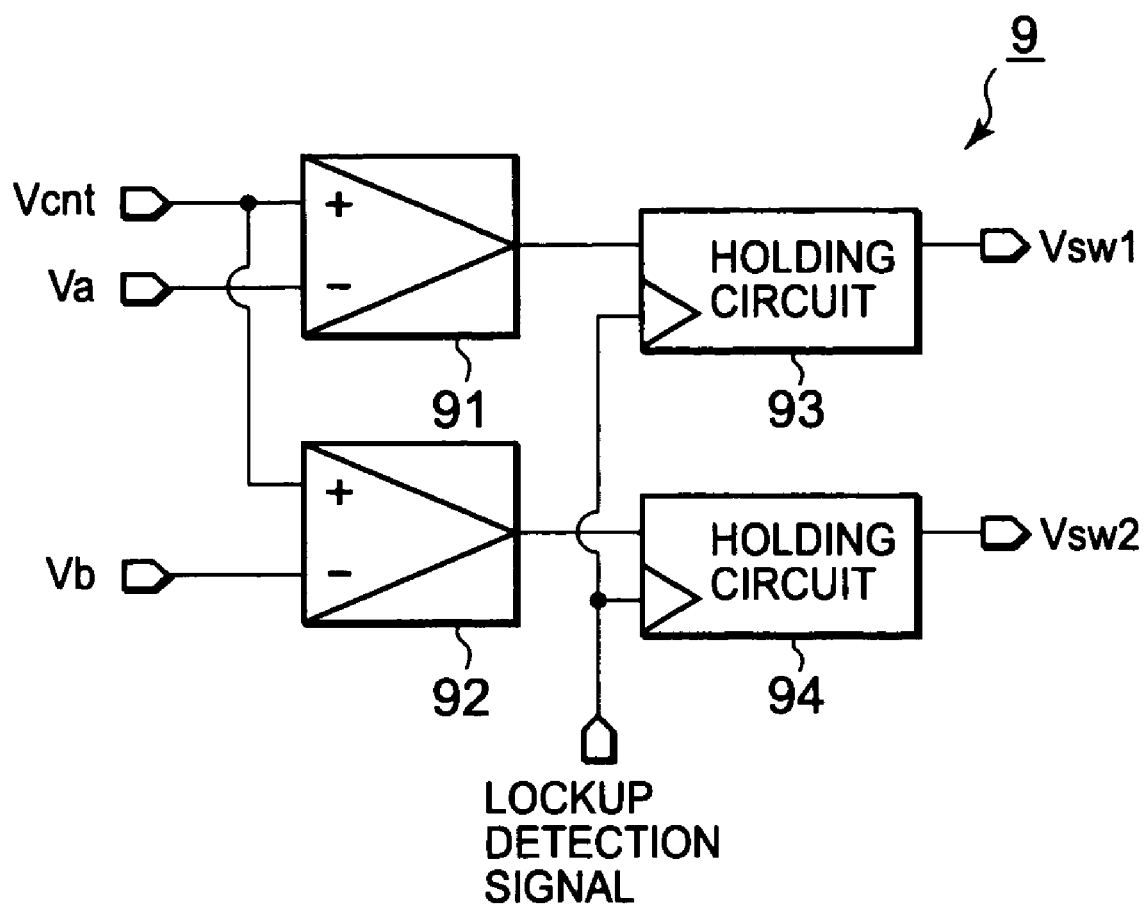
FIG. 12 is a block diagram showing a structure of a control circuit in Embodiment 4 of the present invention.

FIG. 12 is a block diagram showing a structure of the control circuit 9 in Embodiment 4 of the present invention. The voltage comparators 91 and 92 compare the magnitudes of the control voltage Vcnt and the reference voltages Va and Vb, respectively. Holding circuits 93 and 94 transmit output signals from the voltage comparators 91 and 92 as the on/off signals Vsw1 and Vsw2, respectively, before lockup detection. After the lockup detection, the holding circuits 93 and 94 hold immediately preceding output signals from the voltage comparators 91 and 92 as the on/off signals Vsw1 and Vsw2, respectively.

The free-running oscillation frequency of the V/I converter 7 or the conversion gain Kvco thereof is not changed based on the voltage value of the control voltage Vcnt after the lockup detection. The reason for this is that it causes the oscillation state of the PLL circuit to become significantly unstable.

The present invention is not limited to the embodiments described above and thus various modifications can be made without departing from the spirit of the present invention.

What is claimed is:

1. An oscillator comprising:
    a terminal receiving a first signal;
    a voltage-controlled oscillator coupled to said terminal, said voltage-controlled oscillator oscillating to generate a second signal and to change a frequency of said second signal in response to an amplitude of said first signal, and revealing gain-slope characteristics in said frequency of said second signal versus said amplitude of said first signal;
    a control circuit coupled to said voltage-controlled oscillator to alter said gain-slope characteristics in said frequency of said second signal versus said amplitude of said first signal in response to said amplitude of said first signal; and
    a loop filter coupled to said terminal to be operable to generate said first signal, said loop filter including a first plurality of transistor elements and varying said amplitude of said first signal in response to process variability in characteristics of said first plurality of transistor elements.

2. The oscillator according to claim 1,
    wherein said voltage-controlled oscillator reveals a free-running frequency of said second signal and said control circuit is arranged and configured to perform an alternative operation for said free-running frequency in response to said amplitude of said first signal.

3. The oscillator according to claim 1,
wherein said voltage-controlled oscillator comprises a second plurality of transistor elements, each one of said second plurality of transistor elements having the same transistor characteristics as each one of said first plurality of transistor elements.

4. An oscillator comprising:
a terminal receiving a voltage;
a gain circuit coupled to said terminal to convert said voltage into a first current, said gain circuit revealing gain-slope characteristics in said first current versus said voltage;
a current-controlled oscillator coupled to said gain circuit, said current-controlled oscillator sinking said first current from said gain circuit, and oscillating to generate a signal and to change a frequency of said signal in response to said first current;
a control circuit coupled to said gain circuit to alter said gain-slope characteristics in said first current versus said voltage in response to said voltage; and
an offset circuit coupled to said current-controlled oscillator, said offset circuit providing a second current to said current-controlled oscillator to specify a free-running frequency of said signal,
wherein said control circuit is arranged and configured to perform an alternative operation for said free-running frequency in response to said voltage.

5. The oscillator according to claim 4, further comprising:
a loop filter coupled to said terminal to be operable to generate said voltage, said loop filter including a first plurality of transistor elements and varying said voltage in response to process variability in characteristics of said first plurality of transistor elements.

6. The oscillator according to claim 5,
wherein said current-controlled oscillator comprises a second plurality of transistor elements, each one of said second plurality of transistor elements having the same transistor characteristics as each one of said first plurality of transistor elements.

7. The oscillator according to claim 5,
wherein said gain circuit comprises a second plurality of transistor elements, each one of said second plurality of transistor elements having the same transistor characteristics as each one of said first plurality of transistor elements.

8. The oscillator according to claim 5,
wherein said offset circuit comprises a second plurality of transistor elements, each one of said second plurality of transistor elements having the same transistor characteristics as each one of said first plurality of transistor elements.

9. An oscillator comprising:
a terminal receiving a voltage;
a first parallel current path coupled to a first node, said first parallel current path being operable to sink a first current from said first node in response to said voltage;
at least one second parallel current path coupled to said first node, said at least one second parallel current path being operable to sink a second current from said first node in response to said voltage and a first selected control signal of a plurality of control signals;
a mirror circuit coupled to said first node, said mirror circuit being operable to generate a third current responsive to a total current sunk from said first node;
a current-controlled oscillator coupled to said mirror circuit, said current-controlled oscillator sinking said third current from said mirror circuit, and oscillating to generate a signal and to change a frequency of said signal in response to said third current;
a first control circuit coupled to said at least one second parallel current path, said first control circuit being operable to generate said first selected control signal of said plurality of control signals;
at least one third parallel current path coupled to said first node, said at least one third parallel current path being operable to sink a fourth current from said first node in response to said predetermined voltage and a second selected control signal of said plurality of control signals; and
a second control circuit coupled to said at least one third parallel current path, said second control circuit being operable to generate said second selected control signal of said plurality of control signals.

10. The oscillator according to claim 9, further comprising:
a loop filter coupled to said terminal to be operable to generate said voltage, said loop filter including a first plurality of transistor elements and varying said voltage in response to process variability in characteristics of said first plurality of transistor elements.

11. The oscillator according to claim 10,
wherein said current-controlled oscillator comprises a second plurality of transistor elements, each one of said second plurality of transistor elements having the same transistor characteristics as each one of said first plurality of transistor elements.

12. The oscillator according to claim 9,
wherein said first control circuit comprises a first voltage comparator coupled to said at least one second parallel current path, said first control circuit comparing said voltage with a first predetermined reference voltage to produce a first comparison result and to generate said first selected control signal of said plurality of control signals in response to said first comparison result.

13. The oscillator according to claim 12,
wherein said first control circuit further comprises a first latch circuit coupled to said first voltage comparator to latch said first comparison result in response to a lockup signal, said first latch circuit generating said first selected control signal of said plurality of control signals in response to said first comparison result and said lockup signal.

14. The oscillator according to claim 9,
wherein said second control circuit comprises a voltage comparator coupled to said at least one third parallel current path, said second control circuit comparing said voltage with a second predetermined reference voltage to produce a second comparison result and to generate said second selected control signal of said plurality of control signals in response to said second comparison result.

15. The oscillator according to claim 14,
wherein said second control circuit further comprises a second latch circuit coupled to said second voltage comparator to latch said second comparison result in response to a lockup signal, said second latch circuit generating said second selected control signal of said plurality of control signals in response to said second comparison result and said lockup signal.

* * * * *